United States Patent
Yamada

(10) Patent No.: US 6,816,423 B2
(45) Date of Patent: Nov. 9, 2004

(54) SYSTEM FOR CONTROL OF PRE-CHARGE LEVELS IN A MEMORY DEVICE

(75) Inventor: Shigekazu Yamada, Cupertino, CA (US)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/136,034

(22) Filed: Apr. 29, 2002

(65) Prior Publication Data

US 2003/0202411 A1 Oct. 30, 2003

(51) Int. Cl.[7] .................................................. G11C 7/00

(52) U.S. Cl. ....................................................... 365/203

(58) Field of Search .............................. 365/203, 230.06, 365/189.04, 189.03, 189.02, 189.05

(56) References Cited

U.S. PATENT DOCUMENTS

| 5,056,063 A | * | 10/1991 | Santin et al. | ........... 365/182.21 |
| 5,359,571 A | * | 10/1994 | Yu | ......................... 365/185.13 |
| 5,535,167 A | * | 7/1996 | Hazani | ......................... 365/218 |
| 6,480,419 B2 | * | 11/2002 | Lee | ......................... 365/185.18 |

* cited by examiner

*Primary Examiner*—Thong Q. Le
(74) *Attorney, Agent, or Firm*—Sheppard Mullin Richter & Hampton LLP

(57) ABSTRACT

System to control a pre-charge level of a dual bit cell in a memory device. The system includes apparatus comprising a first terminal coupled between first and second memory cells, and a second terminal coupled to the second memory cell. The apparatus also comprises a mirror circuit coupled to the first and second terminals, wherein the mirror circuit operates to maintain the same voltage level on the first and second terminals.

12 Claims, 2 Drawing Sheets

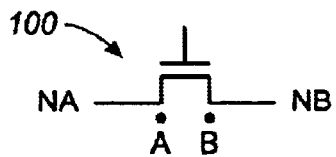
FIG._1 *(PRIOR ART)*
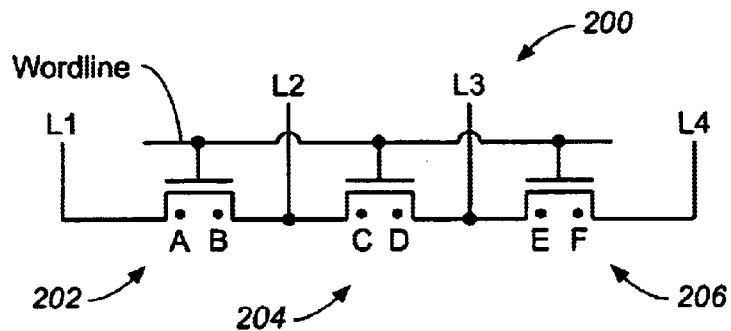
FIG._2
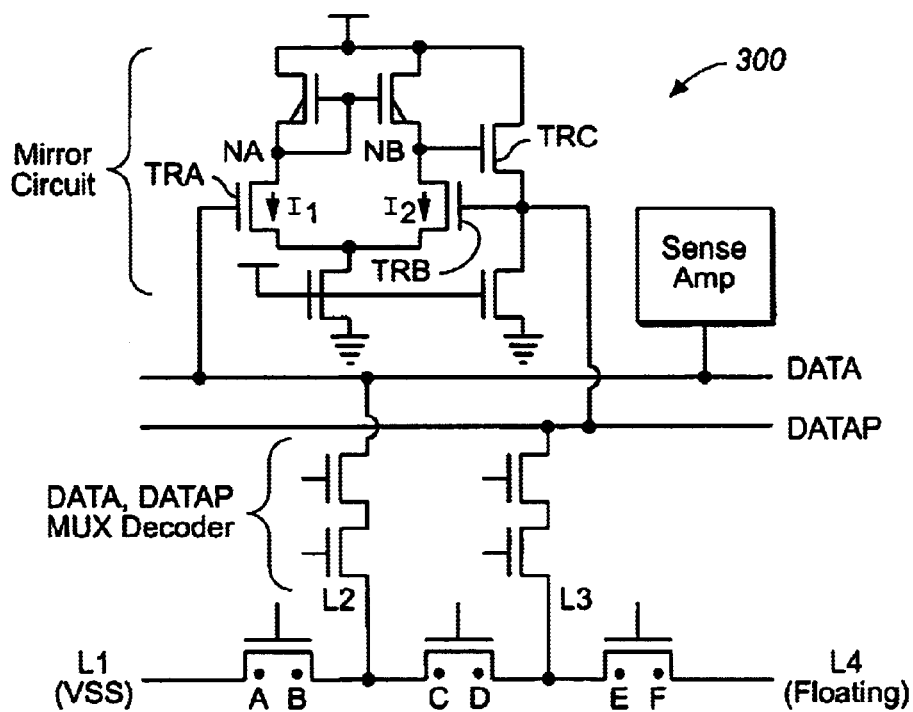
FIG._3

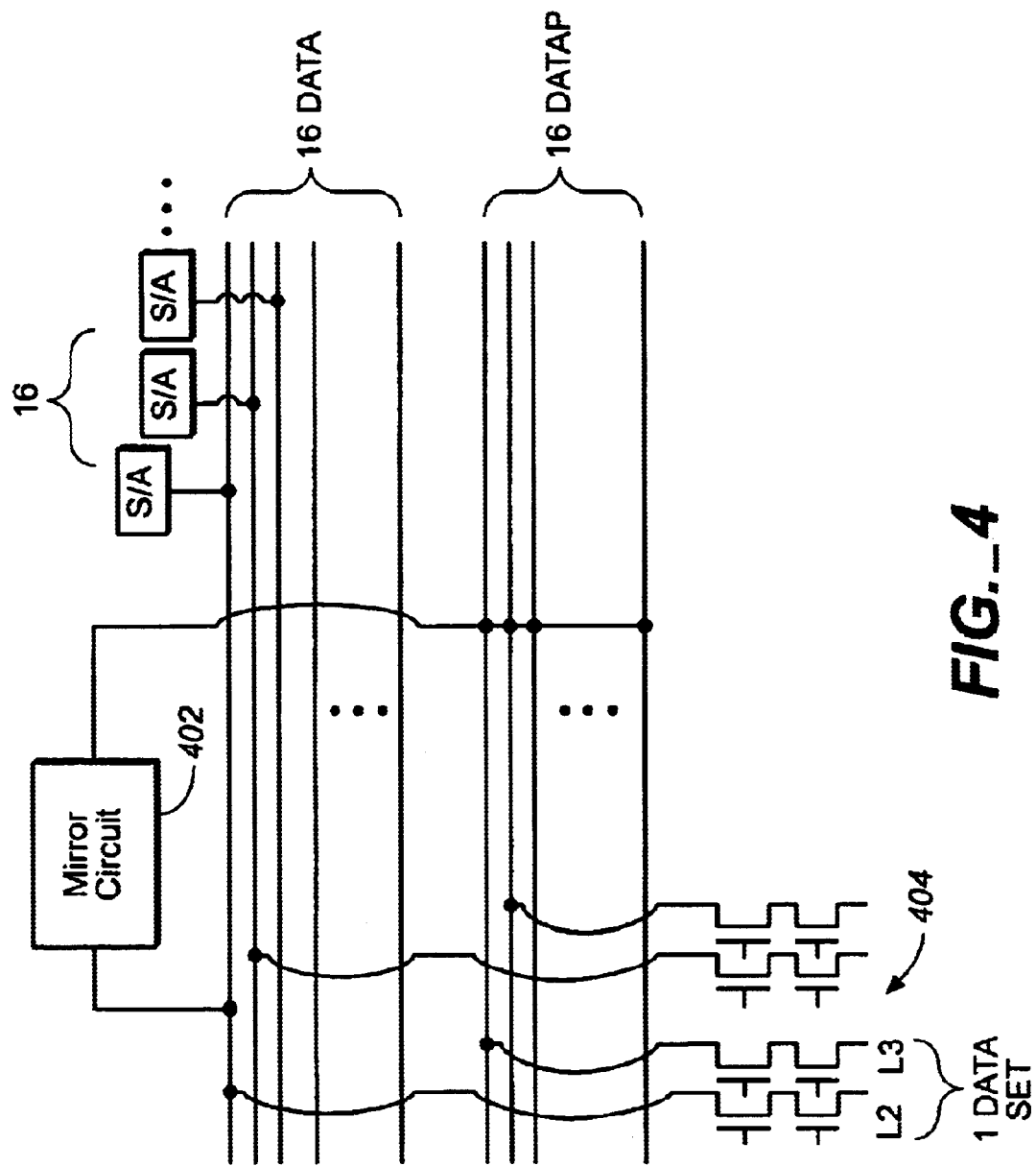
FIG._4

SYSTEM FOR CONTROL OF PRE-CHARGE LEVELS IN A MEMORY DEVICE

FIELD OF THE INVENTION

The present invention relates to semiconductor memory devices, and more particularly, to a system for controlling pre-charge levels in a memory device to reduce the effect of leakage currents.

BACKGROUND OF THE INVENTION

Semiconductor devices, such as memory devices, are commonly used as information storage devices in digital systems. As the amount of information that needs to be stored increases, it has become increasingly important to have an efficient way of accessing such memory devices.

Generally, memory read or write operations are initiated in response to external signals provided to the memory by a controller, such as a processor. In most cases, the amount of information that needs to be transferred during a memory access is large. In addition, the rate at which the information is propagated from a processor to a memory device and vice versa continues to increase. Therefore, increasing performance demands are being placed on the ability to read and write information to memory devices.

In Flash memory technology, there exist double bit core cells that can store two data bits, which result in very high density memory products. FIG. 1 shows a diagram 100 of a typical double bit core cell. The core cell 100 has two data bits (A, B) that can be programmed, erased, or read. If it is desired to read bit A, then terminal NA is operated as a "source" and terminal NB is operated as a "drain." To read bit B, the functions of terminals NA and NB are reversed.

FIG. 2 shows a portion of a memory device 200 that includes three double bit cells (202, 204, 206). If it is desired to read bit A, then terminal L2 operates as a drain. Assuming bits C and D are erased, then terminal L3 must be charged-up in order to prevent leakage current between terminals L2 and L3. If there is leakage current, it will influence the reading of bit A.

One technique that has been used to charge-up terminal L3 is to use the same type of sense amplifier for L2 and L3. When the same sense amplifiers are used for L2 and L3, then the voltage at L2 and L3 should be the same. However, in practical applications this is not the case. For example, the voltage on L2 depends on the status of bit A. If bit A is erased, then the voltage at L2 is lower than the voltage at L3 due to bit A current. Furthermore, the voltage at L3 is also influenced by bit E and bit F even if L4 is floating. Even the voltage difference between L2 and L3 is very small, there is some leakage current, which will affect the reading of bit A. Therefore, using one more sense amplifiers does not solve the leakage problem.

Therefore, it would be desirable to have a way to operate a dual bit memory without incurring the problems caused by leakage currents as outlined above.

SUMMARY OF THE INVENTION

The present invention includes a system to operate cells in a memory device without incurring problems associated with leakage currents. As a result of the operation of one or more embodiments included in the present invention, it is possible to control pre-charge levels of memory cells to avoid leakage current problems.

In one embodiment of the present invention, an apparatus is provided for controlling a pre-charge level of a dual bit memory cell in a memory device. The apparatus comprises a first terminal coupled between first and second memory cells, and a second terminal coupled to the second memory cell. The apparatus also comprises a mirror circuit coupled to the first and second terminals, wherein the mirror circuit operates to maintain the same voltage level on the first and second terminals.

In another embodiment included in the present invention, a method is provided for controlling a pre-charge level of a dual bit memory cell in a memory device. The memory device includes a first terminal coupled between first and second memory cells and a second terminal coupled to the second memory cell. The method comprises steps of inputting a level at the first terminal to an input of a mirror circuit, mirroring the level at the input of the mirror circuit at an output of the mirror circuit, and inputting the level at the output of the mirror circuit to the second terminal.

BRIEF DESCRIPTION OF THE DRAWINGS

The foregoing aspects and the attendant advantages of this invention will become more readily apparent by reference to the following detailed description when taken in conjunction with the accompanying drawings wherein:

FIG. 1 shows a diagram of a typical double bit core cell;

FIG. 2 shows a portion of a memory device that includes three double bit core cells;

FIG. 3 shows a current mirror circuit for providing selected pre-charge levels to dual bit core cells of a Flash memory in accordance with the present invention; and FIG. 4 shows a current mirror circuit constructed in accordance with the present invention for operating with multiple data lines.

DETAILED DESCRIPTION OF THE INVENTION

The present invention includes a system to control pre-charge levels of core cells in a memory device to minimize the effects of leakage currents and improve memory performance. Various embodiments of the system included in the present invention are discussed in detail in the following text.

Exemplary Embodiment

FIG. 3 shows a current mirror circuit 300 for providing selected pre-charge levels to dual bit cells of a Flash memory in accordance with the present invention. For example, the mirror circuit 300 provides pre-charge to L3 (via DATAP). The mirror circuit operates to make the DATAP signal the same as the DATA signal. Thus, the status of bit A will not affect the voltages, since DATAP voltage exactly follows the DATA voltage. As long as the output driver of the mirror circuit 300 is strong enough, the DATAP voltage is forced to follow the DATA voltage even if there is small leakage current between DATAP and L4.

The mirror circuit 300 may comprise any known mirror circuit. During operation of the circuit 300, the current (I1) is mirrored to the current (I2). If the level at DATA goes up, terminal NA goes down, terminal NB goes up, and DATAP goes up through TRC. Since I2 is driven to be the same current as I1, DATAP becomes equivalent to DATA (i.e., Vgs of TRA becomes the same as that of TRB). Therefore, the mirror circuit operates to overcome problems associated with leakage currents.

If the memory device has sixteen data lines, then the number of DATAP lines and mirror circuits would be sixteen also. In this architecture, each DATAP voltage is always the same as its corresponding DATA voltage, regardless of the status of bit A or its surrounding bits (E and F). Generally, mirror circuits are smaller than sense amplifier circuits, so the use of mirror circuits instead of sense amplifier circuits is advantageous in terms of chip area savings.

In another embodiment included in the present invention, it is possible to save additional chip space. In this embodiment, one DATAP signal and one mirror circuit are used to sample a selected one of sixteen DATA lines to generate the same voltage as the selected DATA line. Since one bit A status is different from the others, the DATAP voltage most likely will not be the same as all of the DATA lines. However, the influences from the surrounding bits (i.e., bit E, bit F, and so on) will be reduced significantly. Therefore, a reduction of leakage current effects will be reduced in a cost and space saving manner.

FIG. 4 shows a current mirror circuit constructed in accordance with the present invention for operating with multiple data lines. For example, the mirror circuit 402 is coupled to one DATA line and sixteen DATAP lines. The voltage on the sixteen DATAP lines mirrors the voltage level present on the DATA line. Also shown in FIG. 4 are demultiplexer transistors 404 that are used for each data set. As a result of the operation of the circuit of FIG. 4, the effects of leakage current can be reduced while saving significant chip area since only one mirror circuit is utilized.

The present invention includes a system for controlling pre-charge levels of cells of a memory device. The embodiments described above are illustrative of the present invention and are not intended to limit the scope of the invention to the particular embodiments described. Accordingly, while one or more embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention, which is set forth in the following claims.

What is claimed is:

1. Apparatus for controlling a pre-charge level of a dual bit memory cell in a memory device, the apparatus comprising:

a first terminal coupled between first and second memory cells;

a second terminal coupled to the second memory cell; and a mirror circuit coupled to the first and second terminals, wherein the mirror circuit operates to maintain the same voltage level on the first and second terminals.

2. The apparatus of claim 1, wherein the mirror circuit comprises:

a mirror input coupled to the first terminal; and a mirror output coupled to the second terminal.

3. The apparatus of claim 1, further comprising:

a first decoder logic coupled between the first terminal and the mirror circuit; and a second decoder logic coupled between the second terminal and the mirror circuit.

4. The apparatus of claim 1, wherein one mirror circuit is used for each data line of the memory device.

5. The apparatus of claim 1, wherein one mirror circuit is used for a plurality of data lines of the memory device.

6. The apparatus of claim 5, wherein the one mirror circuit is coupled to a selected data line of the plurality of data lines.

7. A method for controlling a pre-charge voltage level of a dual bit memory cell in a memory device, wherein the memory device includes a first terminal coupled between first and second memory cells and a second terminal coupled to the second memory cell, the method comprising steps the of:

inputting a voltage level at the first terminal to an input of a mirror circuit;

mirroring the voltage level at the input of the mirror circuit at an output of the mirror circuit; and inputting the voltage level at the output of the mirror circuit to the second terminal.

8. The method of claim 7, further comprising a step of providing decoder logic between the first terminal and the mirror circuit and between the second terminal and the mirror circuit.

9. The method of claim 7, further comprising a step of providing a mirror circuit for each data line of the memory device.

10. The method of claim 7, further comprising a step of providing a mirror circuit for a selected data line that is used to reduce the effects of leakage current for all data lines in the memory device.

11. A nonvolatile semiconductor memory comprising:

a plurality of memory cells arranged in a matrix of rows and columns, each memory cell having a drain terminal, a source terminal, and a gate terminal;

a plurality of bit lines, each bit line being disposed between adjacent columns of memory cells and connected to the source or drain terminals of the memory cells of the adjacent columns;

a plurality of word lines, each word line intersecting the plurality of bit lines and being connected to the gate terminals of the memory cells that are disposed along a respective row;

a read voltage supply circuit that supplies a read voltage to a first bit line connected to a drain terminal of a selected memory cell during a read operation; and a mirror circuit connected to said first bit line and that supplies a pre-charge voltage to a second bit line connected to a non-selected memory cell during the read operation, said non-selected memory cell being adjacent to said selected memory cell and disposed in the same row, said non-selected memory cell further having one of its terminals coupled to said first bit line another of its terminals coupled to said second bit line, wherein said mirror circuit equalizes a level of said pre-charge voltage to a level of said read voltage based on a level of said first bit line.

12. The nonvolatile semiconductor memory of claim 11, wherein said memory cells are dual bit memory cells.

* * * * *